United States Patent [19]

Murdoch et al.

[11] Patent Number: 5,572,692
[45] Date of Patent: Nov. 5, 1996

[54] MEMORY CONFIGURATION DECODING SYSTEM HAVING AUTOMATIC ROW BASE ADDRESS GENERATION MECHANISM FOR VARIABLE MEMORY DEVICES WITH ROW ACCESS INTERLEAVING

[75] Inventors: Robert N. Murdoch, Sacramento; Mohammad Z. Khan, Citrus Heights, all of Calif.

[73] Assignee: Intel Corporation, Santa Clara, Calif.

[21] Appl. No.: 143,984

[22] Filed: Oct. 27, 1993

Related U.S. Application Data

[63] Continuation of Ser. No. 814,409, Dec. 24, 1991, abandoned.

[51] Int. Cl.⁶ ................................................. G06F 12/06
[52] U.S. Cl. .................................. 395/405; 395/497.03
[58] Field of Search ..................................... 395/425, 400, 395/405, 497.03; 364/200 MS File, 900 MS File

[56] References Cited

U.S. PATENT DOCUMENTS

| | | | |
|---|---|---|---|
| 3,796,996 | 3/1974 | Curley et al. | 395/484 |
| 4,107,774 | 8/1978 | Joyce et al. | 395/375 |
| 4,268,901 | 5/1981 | Subrizi et al. | 395/400 |
| 4,400,794 | 8/1983 | Koos | 395/400 |
| 4,430,701 | 2/1984 | Christian et al. | 395/400 |
| 4,442,504 | 4/1984 | Dummermuth et al. | 395/725 |
| 4,467,421 | 8/1984 | White | 395/425 |
| 4,787,060 | 11/1988 | Boudreau et al. | 395/425 |
| 4,819,152 | 4/1989 | Deerfield et al. | 395/421.07 |
| 4,870,622 | 9/1989 | Aria et al. | 365/230.02 |
| 4,899,272 | 2/1990 | Fung et al. | 365/230.03 |
| 5,027,329 | 6/1991 | Foss | 365/230.02 |
| 5,109,336 | 4/1992 | Guenther et al. | 395/425 |
| 5,134,699 | 7/1992 | Aria et al. | 395/425 |
| 5,138,706 | 8/1992 | Melo et al. | 395/500 |
| 5,161,102 | 11/1992 | Griffin et al. | 395/800 |
| 5,185,877 | 2/1993 | Bissett et al. | 395/425 |
| 5,210,839 | 5/1993 | Powell et al. | 395/400 |
| 5,218,684 | 6/1993 | Hayes et al. | 395/400 |
| 5,293,607 | 3/1994 | Brockmann et al. | 395/484 |
| 5,357,621 | 10/1994 | Cox | 395/400 |
| 5,412,788 | 5/1995 | Collins et al. | 395/484 |

*Primary Examiner*—Matthew M. Kim
*Attorney, Agent, or Firm*—Blakely, Sokoloff, Taylor & Zafman

[57] ABSTRACT

A memory configuration system including a memory controller comprising a set of memory configuration registers which store information related to memory devices installed in random access memory. The memory configuration registers correspond to one or more rows of memory banks in the random access memory. The memory controller also includes a row size and mask generator coupled to the memory configuration register set and a memory configuration decoder coupled to the row size and mask generator. The combination of logic within the row size and mask generator and the memory configuration decoder is used to generate a base address for each row of memory locations within the random access memory. The present invention automatically reconfigures the memory array to define the most populous row as Row 0 regardless of where the largest row is physically populated. This reconfiguration of the memory array is the logical to physical mapping feature provided by the present invention. As an additional feature, the present invention provides a default memory configuration means (i.e. default ordering of rows) for performing the logical to physical mapping in a predictable manner when two or more rows are populated with equal amounts of memory.

9 Claims, 5 Drawing Sheets

FIG. 3

| Row n | Bank 0 | Bank 1 | Bank 2 | Bank 3 |
|---|---|---|---|---|

301

Valid Configurations:
bank 0 only
bank 1 only
bank 2 only
bank 3 only
banks 0 and 1
banks 2 and 3
all banks (0,1,2,3)
no banks Invalid Configurations:
banks 0 and 3
banks 1 and 2
banks 0 and 2
banks 1 and 3

FIG. 4

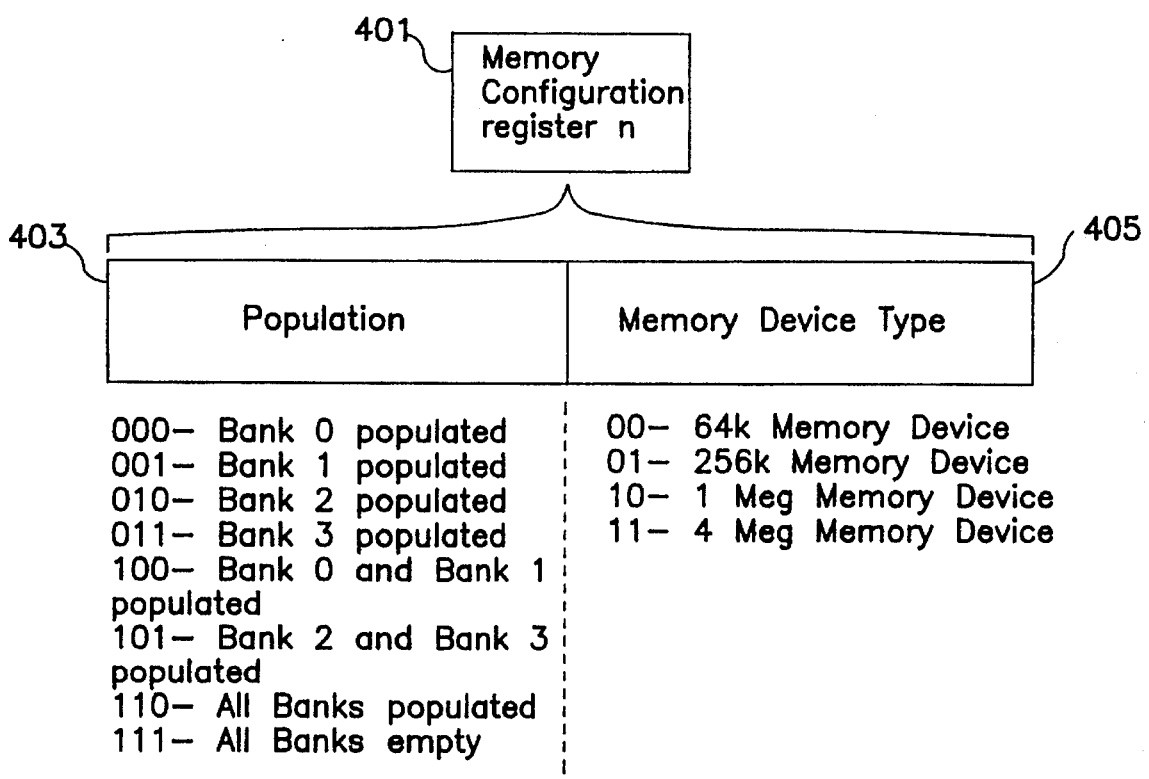

401 — Memory Configuration register n

| Population | Memory Device Type |
|---|---|

403, 405

000— Bank 0 populated
001— Bank 1 populated
010— Bank 2 populated
011— Bank 3 populated
100— Bank 0 and Bank 1 populated
101— Bank 2 and Bank 3 populated
110— All Banks populated
111— All Banks empty 00— 64k Memory Device
01— 256k Memory Device
10— 1 Meg Memory Device
11— 4 Meg Memory Device

MEMORY CONFIGURATION DECODING SYSTEM HAVING AUTOMATIC ROW BASE ADDRESS GENERATION MECHANISM FOR VARIABLE MEMORY DEVICES WITH ROW ACCESS INTERLEAVING

This is a continuation of application Ser. No. 07/814,409, filed Dec. 24, 1991, now abandoned.

BACKGROUND OF THE INVENTION

1. Field of the Invention

The present invention relates to the field of computer systems. Specifically, the present invention relates to memory controllers for computers.

2. Related Art

An important component of any computer system is a memory array. The memory array is used for the storage of data and processing instructions for the processor or other resources of a computer system. Computer systems operating in different applications have different requirements as to the size of the memory array. A general purpose computer system typically supports a number of memory configurations in order to optimize the system for a particular application. Different memory configurations are implemented by inserting variable type and size memory devices in the memory array. In most prior art computer systems, the memory array is comprised of dynamic random access memory (DRAM) devices. DRAMs are manufactured as semiconductor devices or chips of various types and sizes. For example, DRAMs of a 64K, 256K, 1M, or 4M bit type are commonly available devices. Further, these devices may include one or more bits of information storage for each location. Thus, a particular memory array may be configured by inserting the appropriate type and size DRAMs as needed for a particular application.

Prior art computer systems also typically include a memory controller for controlling access to the memory array. Although various types and sizes of DRAMs may be installed in the memory array, the memory controller must be configured properly in order to correctly control access to the DRAMs installed in the memory array. In some prior art computer systems, the memory controller is configured by use of hardware switches for specifying a plurality of memory configuration parameters. These parameters include the presence of a memory device in a particular memory bank, the type and/or size of a memory device in a particular bank, and the base or starting address of a particular memory bank. Other memory configuration parameters may be necessary in other computer systems. Computer systems employing hardware switches for configuring the memory controller are prone to problems with improperly configured switches and not conveniently reconfigurable. In fact, any system that requires the pre-computation and storage of base addresses is inherently vulnerable to error conditions where the pre-computed base address does not match the actual memory configuration.

U.S. Pat. No. 4,899,272, titled "Addressing Multiple Types Of Memory Devices", naming inventors Michael G. Fung and Justin Wang, and filed Oct. 23, 1987 (denoted herein as the '272 Patent) discloses a memory addressing system that can accommodate multiple size DRAMs. The '272 Patent teaches a memory addressing system providing a hardware register associated with each pair of banks of DRAMs. These hardware registers are programmable to indicate the type of DRAMs that have been inserted in the particular memory banks and to indicate the starting address of the particular set of memory banks.

Although the '272 Patent describes a more easily configured system than prior art systems using hardware jumpers or switches, the '272 Patent approach nevertheless is subject to significant problems. The approach in the '272 Patent requires that the starting address of each memory bank be determined in advance and programmed into its associated hardware register. The starting address for each memory bank, however, is difficult to compute and awkward to manipulate. Thus, errors caused by an improperly configured hardware register are possible.

Thus, a better memory configuration system for use with variable type and size memory devices is needed.

SUMMARY OF THE INVENTION

The present invention is a memory configuration system for use with variable type memory devices in a computer system. The memory configuration system includes a memory controller comprising a set of memory configuration registers which store information related to memory devices installed in random access memory. The memory configuration registers correspond to one or more rows of memory banks in the random access memory. The memory controller also includes a row size and mask generator coupled to the memory configuration register set and a memory configuration decoder coupled to the row size and mask generator. The combination of logic within the row size and mask generator and the memory configuration decoder is used to generate a base address for each row of memory locations within the random access memory. A row base address and a row size mask generated by the row size and mask generator is provided to row hit detect logic. Row hit detect logic also receives an address on address lines which represents an address being provided to the memory controller by a processor in a current memory access request. The row hit detect logic determines if the address received on the address lines is within an address region defined by the row base address plus the size of the memory row as defined by the row size mask. If this is the case, a row hit signal is output on a control line. Page hit detect logic also receives the address on the address lines. The page hit detect logic also receives row size masks from the memory configuration decoder. The page hit detect logic generates a page hit signal on a control line if the address received on the address lines is within a currently open page. Timing logic receives a page hit signal on a control line and a row hit signal on another control line and generates memory access control signals which are output to the DRAMs of the random access memory. Memory access control signals comprise a row address strobe (RAS) signal, a column address strobe (CAS), a memory data strobe (MDS), and a write enable (WE) signal. In addition to RAS, CAS, MDS and WE, the DRAMs of the random access memory also receive row and column addresses on address lines.

In order to simplify address decoding logic, the most desirable configuration for the DRAM array is that the most populous (i.e. largest) row reside in the lowest numbered row (i.e. Row 0). In the prior art, memory system designers and users were forced to populate the memory in such a configuration. In the present invention, it is not necessary to populate the memory array with the largest row being Row 0. Instead, the present invention automatically reconfigures the memory array to define the most populous row as Row 0 regardless of where the largest row is physically populated. This reconfiguration of the memory array is the logical to physical mapping feature provided by the present invention. As an additional feature, the present invention provides a default memory configuration means (i.e. default ordering of rows) for performing the logical to physical mapping in a predictable manner when two or more rows are populated with equal amounts of memory.

It is therefore an object of the present invention to provide a memory configuration system for use with variable type and size DRAM devices. It is a further object of the present invention to provide a memory configuration system for which a starting address for each bank of memory neither needs to be predetermined nor stored in a memory configuration register. It is a further object of the present invention to provide a memory configuration system wherein the starting addresses for each bank are automatically computed. It is a further object of the present invention to provide a memory configuration system wherein a base address and a mask pattern are combined with an incoming address to determine if the address is within the range of a certain memory row. It is a further object of the present invention to provide a more easily configured memory configuration system. It is a further object of the present invention to provide a memory configuration system wherein row interleaving information is included in the computation of a base address for each memory bank. Row interleaving is a technique whereby memory accesses are alternated between two rows in order to increase the speed of the accesses.

These and other objects of the present invention will become apparent as presented and described in the following detailed description of the preferred embodiment.

BRIEF DESCRIPTION OF THE DRAWINGS

FIG. 3 illustrates the structure of a memory row.

FIG. 4 illustrates the contents of a memory configuration register.

DETAILED DESCRIPTION OF THE PREFERRED EMBODIMENT

The present invention is a memory configuration system for use with variable type memory devices in a computer system. In the following description, numerous specific details are set forth in order to provide a thorough understanding of the present invention. However, it will be apparent to one of ordinary skill in the art that these specific details need not be used to practice the present invention. In other instances, well known structures, circuits, and interfaces have not been shown in detail in order not to unnecessarily obscure the present invention.

Figure 1:
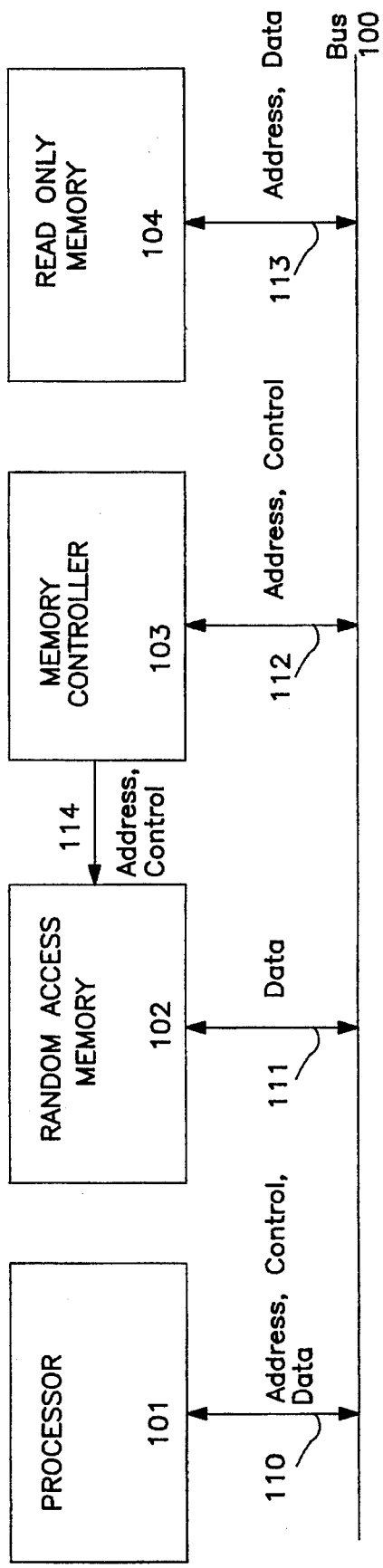
FIG. 1 is an illustration of a typical architecture of the computer system of the present invention.

Referring to FIG. 1, a block diagram illustrates the architecture of the computer system in which the present invention operates. In general, such computer systems comprise a bus 100 for communicating information, a processor 101 coupled with the bus for processing information, a main memory or random access memory (RAM) 102 coupled with the bus for storing information and instructions for the processor 101, and memory controller 103 coupled with bus 100 for controlling memory access to RAM 102 by processor 101 or other devices coupled to bus 100. Processor 101 is coupled to bus 100 via lines 110 which include address, data, and control lines. Random access memory 102 is coupled to bus 100 via lines 111 which comprise data lines. Memory controller 103 is coupled to bus 100 via lines 112 which comprise address and control lines. Memory controller 103 is further coupled to random access memory 102 via lines 114 which are comprised of address and control lines. A computer system for use with the present invention may also optionally include read only memory (ROM) 104 coupled to bus 100 via line 113 for non-volatile storage of processing logic and data.

In a normal mode of operation, processor 101 applies an address and control signals to bus 100 via lines 110. Memory controller 103 receives the address and control signals from bus 100 via lines 112. Depending upon the specified address and control signals, memory controller 103 applies memory access control signals to random access memory 102 via lines 114. On receipt of the memory access control signals from memory controller 103, data is transferred via data lines 111 into random access memory 102 from bus 100 for a write operation, or data is transferred from random access memory 102 onto bus 100 via data lines 111 for a read operation. Data is read or written by a processor 101 using lines 110 and bus 100. Similarly, other devices may access random access memory 102 using bus 100.

Figure 2:
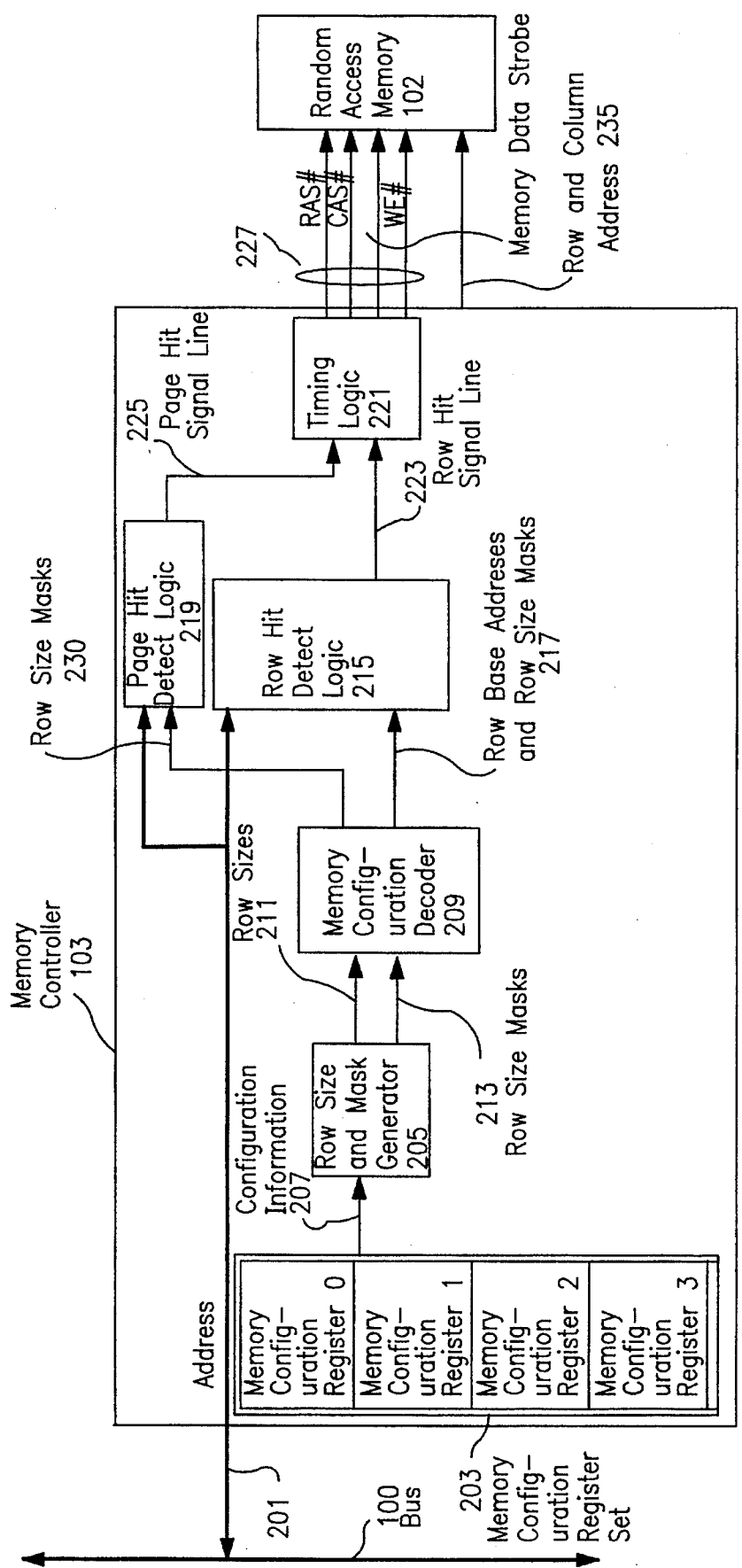
FIG. 2 is a block diagram of the internal structure of the memory controller of the present invention.

Referring now to FIG. 2, a block diagram of the internal architecture of memory controller 103 is illustrated. Memory controller 103 comprises a set of memory configuration registers which store information related to memory devices installed in random access memory 102. A detailed description of the contents of memory configuration registers 203 is provided below in relation to FIGS. 3 and 4. In the preferred embodiment of memory controller 103, four memory configuration registers 203 are provided. The four memory configuration registers 203 correspond to four rows of memory banks (not shown) in random access memory 102. It will be apparent to those skilled in the art that a greater or fewer number of rows of memory banks may be provided in random access memory 102 and, therefore, a greater or fewer number of memory configuration registers 203 may be provided in memory controller 103.

Memory controller 103 also includes a row size and mask generator 205 coupled to memory configuration register set 203 and a memory configuration decoder 209 coupled to row size and mask generator 205. The combination of logic within row size and mask generator 205 and memory configuration decoder 209 is used to generate a base address for each row of memory locations within random access memory 102. The structure of a row of memory locations in random access memory 102 is described below in relation to FIG. 3. The operation of row size and mask generator 205 and memory configuration decoder 209 is described below in relation to examples illustrated in FIGS. 5 and 6.

A row base address and a row size mask is provided on line 217 to row hit detect logic 215. Row hit detect logic 215 also receives an address on address lines 201 which represents an address being provided to memory controller 103 by processor 101 in a current memory access request. Row hit detect logic 215 determines if the address received on lines 201 is within an address region defined by the row base address plus the size of the memory row as defined by the row size mask. If this is the case, a row hit signal is output on line 223. The generation of the row base address and the row size mask is described below.

Page hit detect logic 219 receives the address on lines 201. Page hit detect logic 219 also receives row size masks from memory configuration decoder 209. The generation of these masks is discussed below. Page hit detect logic 219 generates a page hit signal on line 225 if the address received on line 201 is within a currently open page.

The DRAM memory array is organized as a number of rows (Row 0–Row 3 in the preferred embodiment). Each row has up to four banks. A certain number of banks may be populated at any time depending upon how the memory array is configured.

Each row is also organized as consisting of a number of pages such that at any time an access is made to a location in memory, that location resides in a certain page of the row.

For completing a memory access, the certain page is "activated" and the referenced data is read. Activation of a page involves a hardware precharge cycle and requires a period of time as well known in the art. In page mode operation of the device, the page is NOT deactivated after the access is completed. If a subsequent access is made to the same page (even though the access may be made to a different location in that page), the time necessary for activation of the page can be saved.

In page mode operation of the DRAMs, significant performance can be gained if successive accesses to memory are within the same page. The page hit detector logic is used to determine if successive memory accesses are within the same page.

Timing logic 221 receives a page hit signal on line 225 and a row hit signal on line 223 and generates memory access control signals 227 which are output to the DRAMs of random access memory 102. Memory access control signals 227 comprise a row address strobe (RAS) signal, a column address strobe (CAS), a memory data strobe (MDS), and a write enable (WE) signal. In addition to RAS, CAS, MDS and WE, the DRAMs of random access memory 102 also receive row and column addresses on line 235. The structure and operation of memory configuration registers 203, row size and mask generator 205, memory configuration decoder 209, row hit detect logic 215, and page hit detect logic 219 improves the operation of memory controller 103 and provides the primary substance of the present invention as described herein.

Referring now to FIG. 3, memory locations within random access memory device 102 are organized in rows and columns. A single row 301 of random access memory 102 is illustrated in FIG. 3. It will be apparent to those skilled in the art that random access memory comprises one or more such rows. Memory Row 301 is comprised of four banks of memory in the preferred embodiment of the present invention. It will be apparent to those skilled in the art that each row may be comprised of a greater or lesser number of banks per row. Each bank of Row 301 is implemented in the preferred embodiment as a single or group of dynamic random access memory (DRAM) devices commercially available in the form of a semiconductor integrated circuit chip. Because the memory controller of the present invention supports more than one size and type of dynamic random access memory, particular banks of each row may or may not be populated with a memory device.

In the preferred embodiment, each row of random access memory 102 may only be populated in the following configurations: bank 0 only, bank 1 only, bank 2 only, bank 3 only, banks 0 and 1, banks 2 and 3, all banks, and no banks (i.e. bank 0 and bank 3 in combination or bank 1 and bank 2 in combination or bank 0 and bank 2 in combination or bank 1 and bank 3 in combination are not a valid population configurations). Similarly, banks of each row may be populated with different types and sizes of memory devices. However, in the preferred embodiment, all DRAMs must be of the same type and size in the same row, but two different rows can have different types and sizes of DRAMs.

The highly configurable nature of the memory controller of the present invention makes the calculation of a base address (equivalently called a starting address) for each row particularly difficult. The base address is the address of the first memory location residing in the particular row. Prior art systems require that a base address for each row be pre-computed and stored in a register of the memory controller. This solution, however, is prone to programming errors, is not automatic, and is more difficult to reconfigure. The present invention provides a solution whereby the base address of each row is automatically computed.

Referring now to FIG. 4, the information retained by each of the memory configuration registers of register set 203 is illustrated. A memory configuration register 401 is provided in memory controller 103 for each row of memory in random access memory 102. In the preferred embodiment, the memory array is comprised of four rows (Row 0 through Row 3). Thus, four memory configuration registers (register 0 through register 3) corresponding to Rows 0 through Row 3 are provided.

Each memory configuration register 401 comprises a population field 403 and a memory device type field 405. The population field 403 is used to specify which, if any, banks in the row associated with the memory configuration register are populated with memory devices. As shown in FIG. 4, the preferred embodiment uses a 3 bit value to encode population information into population field 403. It will be apparent to those skilled in the art that a greater or fewer number of data bits may be used to encode population information. In the preferred embodiment, binary values 000–011 may be used to define the presence of a memory device in banks 0–3, respectively. Binary value 100 may be used to define the installation of a memory device in both bank 0 and bank 1. Similarly, binary value 101 may be used to define the installation of a memory device in banks 2 and 3. A binary value of 110 may be used to define the population of all four banks of a row, and binary value 111 may be used to specify the absence of memory devices in all banks of a row.

Whenever a row is populated with two or more banks of memory devices, bank interleaving is automatically enabled. All memory in a row must be the same type of memory device. In contrast to bank interleaving, some rows may be interleaved. Row interleaving is also referred to as page interleaving. For rows to be interleaved, all memory in each interleaved row must be the same type of memory device. In the preferred embodiment, Row 0 may only be interleaved with Row 2; Row 1 may only be interleaved with Row 3.

Having defined the presence or absence of memory devices using population field 403, memory device type field 405 is used to define the type of memory devices installed in banks of the row associated with the memory configuration register. In the preferred embodiment, two binary bits are used to encode memory device type information. It will be apparent to those skilled in the art, however, that a greater or fewer number of bits may be used to specify memory device type information. In the preferred embodiment, a binary value of 00 defines a 64K memory device installed in one or more banks of the row. A binary value of 01 defines a 256K memory device. A binary value of 10 defines a 1M memory device, and a binary value of 11 defines a 4M memory device. It will be apparent to those skilled in the art that other commonly available memory device types may be encoded into memory device type field 405 using additional bits. It will also be apparent to those skilled in the art that other types of configuration information may be stored in each memory configuration register. Note, however, that in the preferred embodiment of the present invention, a base address or starting address for each row is not stored in a memory configuration register or other register of memory controller 103. Thus, necessary pre-computed or pre-specified information for memory controller 103 is held to a minimum. A memory configuration register is provided within memory controller 103 for each row of memory within random access memory 102. Thus, the structure of information contained within a memory configuration register as illustrated in FIG. 4 is replicated for as many configuration registers as necessary depending upon the number of rows provided in random access memory 102.

Figure 5:
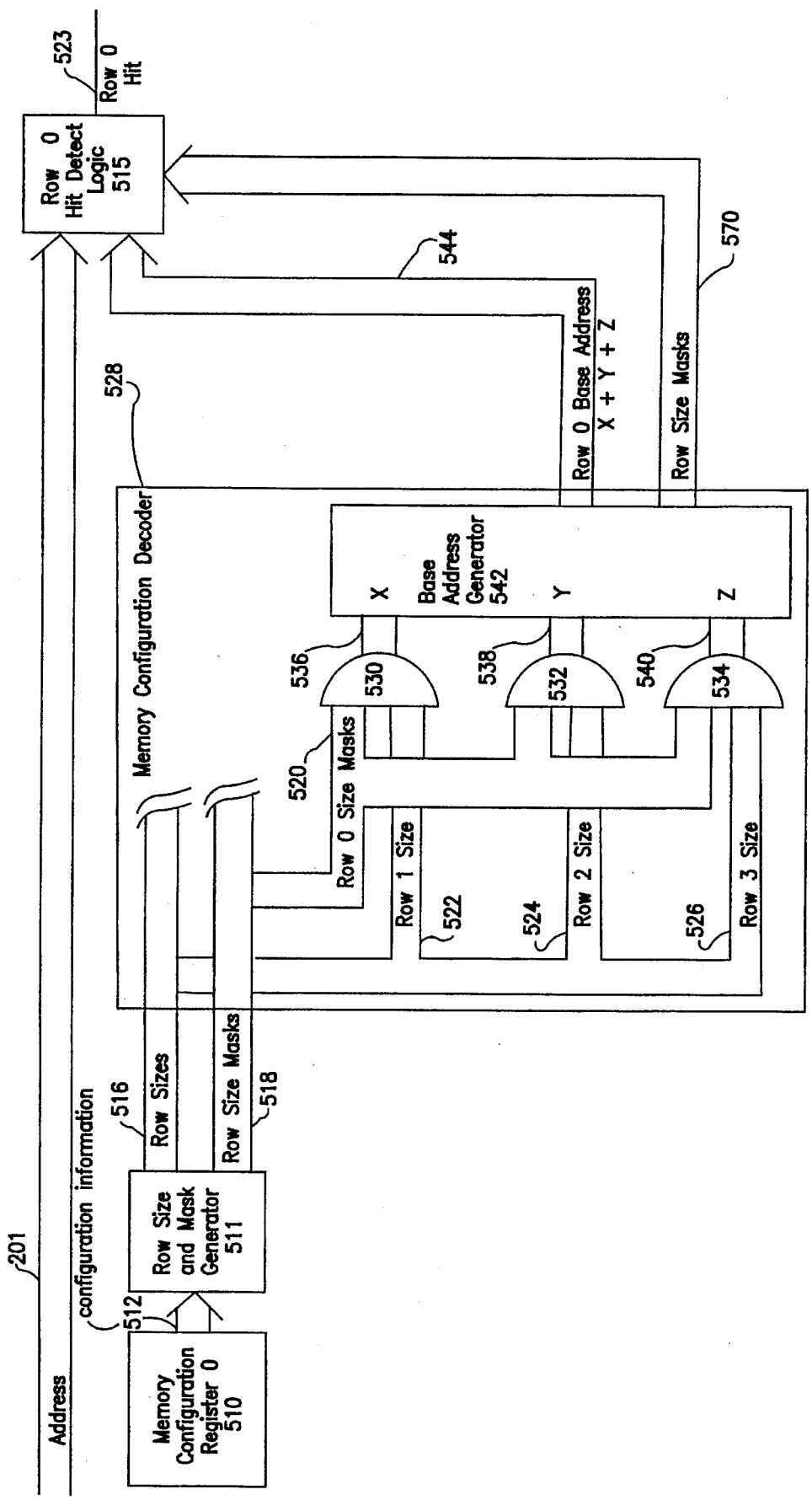
FIG. 5 is a block diagram of the internal structure of the memory configuration decoder for Row 0.

Referring to FIG. 5, an example of the operation of the present invention for the first row (Row 0) in random access memory 102 is illustrated. It will be apparent to those skilled in the art that the circuitry illustrated in FIG. 5 is similar for each row of memory in random access memory 102. Additional logic is provided for subsequent rows of random access memory 102 to provide for the default ordering of rows as described below in relation to FIG. 6.

As shown in FIG. 5, a memory configuration register 510 corresponding to Row 0 is provided. Memory configuration register 510 contains configuration information including population information and memory device type information as described above in relation to FIG. 4. Configuration information stored in memory configuration register 510 is received by row size and mask generator 511 via lines 512. As described above, the present invention provides a row size and mask generator 511 for each row of random access memory 102. In the example illustrated in FIG. 5, row size and mask generator 511 is associated with Row 0. In an alterative embodiment, a single Row size and mask generator 511 may be provided with multiple inputs for each row.

Row size and mask generator 511 uses memory configuration register information to generate a value corresponding to the size of a row in megabytes. This value denotes row size and is output by row size and mask generator 511 on lines 516.

By way of example, row 0 may be populated with 4M×1 bit memory devices. For this example, the population field in memory configuration register 510 would contain 000 and the memory device type field would contain 11 in binary. The configuration specified in this example would result in a row size of 0000100 in binary being output on lines 516. The same row size value would result if all four memory banks of this row were populated with 1M memory devices. A distinct row size value is output on lines 516 for each of the memory rows in random access memory 102.

Row size and mask generator 511 also uses memory configuration information to generate an address mask which is output on lines 518. The row size mask is a value which when ANDed with a test row size produces a non-zero value if the test row size is larger in magnitude than the row size with which the row size mask is associated. Thus, for the example described above for a row populated with 4M DRAMs, the row size and mask generator 511 generates a row size mask for Row 0 with a value of 1111000 in binary and outputs the row size mask on lines 518. A distinct row size mask is generated and output on lines 518 for each row of random access memory 102.

By virtue of the information organized and stored in memory configuration registers 401 and the means for generating row sizes and row size masks, described herein, the base address for each row is positioned on an address that is an integral multiple of the row size. This arrangement simplifies the row hit detect logic 215 and page hit detect logic 219 by allowing a row hit condition or page hit condition to be determined after testing only a minimum number of address bits as defined by the row size mask.

A row size and row size mask is generated for each row by row size and mask generator 511 and output to memory configuration decoder 528 as illustrated in FIG. 5. Memory configuration decoder 528 receives a row size and row size mask for each row and generates a base address for the corresponding row. The manner in which a base address for each row is generated is illustrated by way of example for Row 0 in FIG. 5.

The row size mask 520 generated for Row 0 is provided as input to each of three ANDing circuits 530, 532, and 534. ANDing circuit 530 also receives as input on line 522 the row size for Row 1. Similarly, ANDing circuit 532 receives as input on line 524 the row size for Row 2. ANDing circuit 534 receives on line 526 the row size for Row 3. It will be apparent to those skilled in the art that additional rows may be supported by the present invention by adding an additional number of ANDing circuits corresponding to the number of rows in random access memory 102.

ANDing logic 530, 532, and 534 receives the Row 0 row size mask and a row size for each of the other or remaining (i.e. rows other than Row 0) rows. The ANDing logic 530, 532, and 534 is used to determine which of the other or remaining (i.e. rows other than Row 0) rows are larger than Row 0. For example, ANDing logic 530 combines the Row 0 row size mask 520 with the Row 1 row size 522 to produce a result output on line 536. The result provided on line 536 will be zero if the size of Row 1 is less than or equal to the size of Row 0. If, however, the size of Row 1 is greater than the size of Row 0, the result output on line 536 is the size of Row 1.

A similar comparison for Row 0 row size mask 520 and Row 2 row size 524 is performed by ANDing logic 532 and output on line 538. Again, if the size of Row 2 is less than or equal to the size of Row 0, the output provided on line 538 will be zero. If, however, the size of Row 2 is greater than the size of Row 0, the size of Row 2 is output on line 538.

ANDing logic 534 combines the Row 0 row size mask with the Row 3 row size to produce an output on line 540 of zero if the size of Row 3 is less than or equal to the size of Row 0. Alternatively, ANDing logic 534 outputs the size of Row 3 on line 540 if the size of Row 3 is greater than the size of Row 0.

Each of the outputs (i.e. outputs on lines 536, 538, and 540) produced by the ANDing logic is provided as input to a base address generator 542. Base address generator 542 sums the input received on line 536, line 538, and line 540 to produce a Row 0 base address output on line 544. The Row 0 base address output on line 544 will be zero if the size of each of the non-Row 0 rows is less than or equal to the size of Row 0. Alternatively, the Row 0 base address output on line 544 will be the summation of the size of those non-Row 0 rows that are greater than the size of Row 0. It will be apparent to those skilled in the art that a base address for other rows of random access memory 102 may be computed in a similar manner.

The Row 0 base address generated by Base address generator 542 is input by Row 0 hit detect logic 515 on line 544. Row 0 hit detect logic 515 also receives on line 570 the row size masks generated by Row size and mask generator 511. Row 0 hit detect logic 515 also receives an address on lines 201. The address received on lines 201 is an address associated with a currently active memory access request (i.e. a current address). Row 0 hit detect logic 515 compares the current address received on lines 201 with the Row 0 base address received on lines 544. Using the row size mask, Row 0 hit detect logic 515 does not need to test the entire address received on line 201. Rather, only the portion of the address for which corresponding bits of the row size mask are set to one need to be tested against the row base address. If the current address is within the Row 0 base address range, an active Row 0 hit signal is output to timing logic 221 (not shown in FIG. 5) on line 523. If, however, the current address is not within the Row 0 base address range, the Row 0 hit signal on line 523 is not asserted. The Row 0 hit signal output on line 523 is used by timing logic 221 to optimize timing signal generation for access to Row 0. Thus, the present invention can be used to automatically generate a base address for Row 0 without the need for storing the Row 0 base address or starting address in a programmable register or a set of hardware jumpers. The automatic generation of a base address or starting address for other rows of random access memory 102 may be performed in a manner similar to that described above for the generation of a base address for Row 0.

In order to simplify address decoding logic, the most desirable configuration for the DRAM array is that the most populous (i.e. largest) row reside in the lowest numbered row (i.e. Row 0). In the prior art, memory system designers and users were forced to populate the memory in such a configuration. In the present invention, it is not necessary to populate the memory array with the largest row being Row 0. Instead, the present invention automatically reconfigures the memory array to define the most populous row as Row 0 regardless of where the largest row is physically populated. This reconfiguration of the memory array is the logical to physical mapping feature provided by the present invention. As an additional feature, the present invention provides a default memory configuration means (i.e. default ordering of rows) for performing the logical to physical mapping in a predictable manner when two or more rows are populated with equal amounts of memory.

Figure 6:
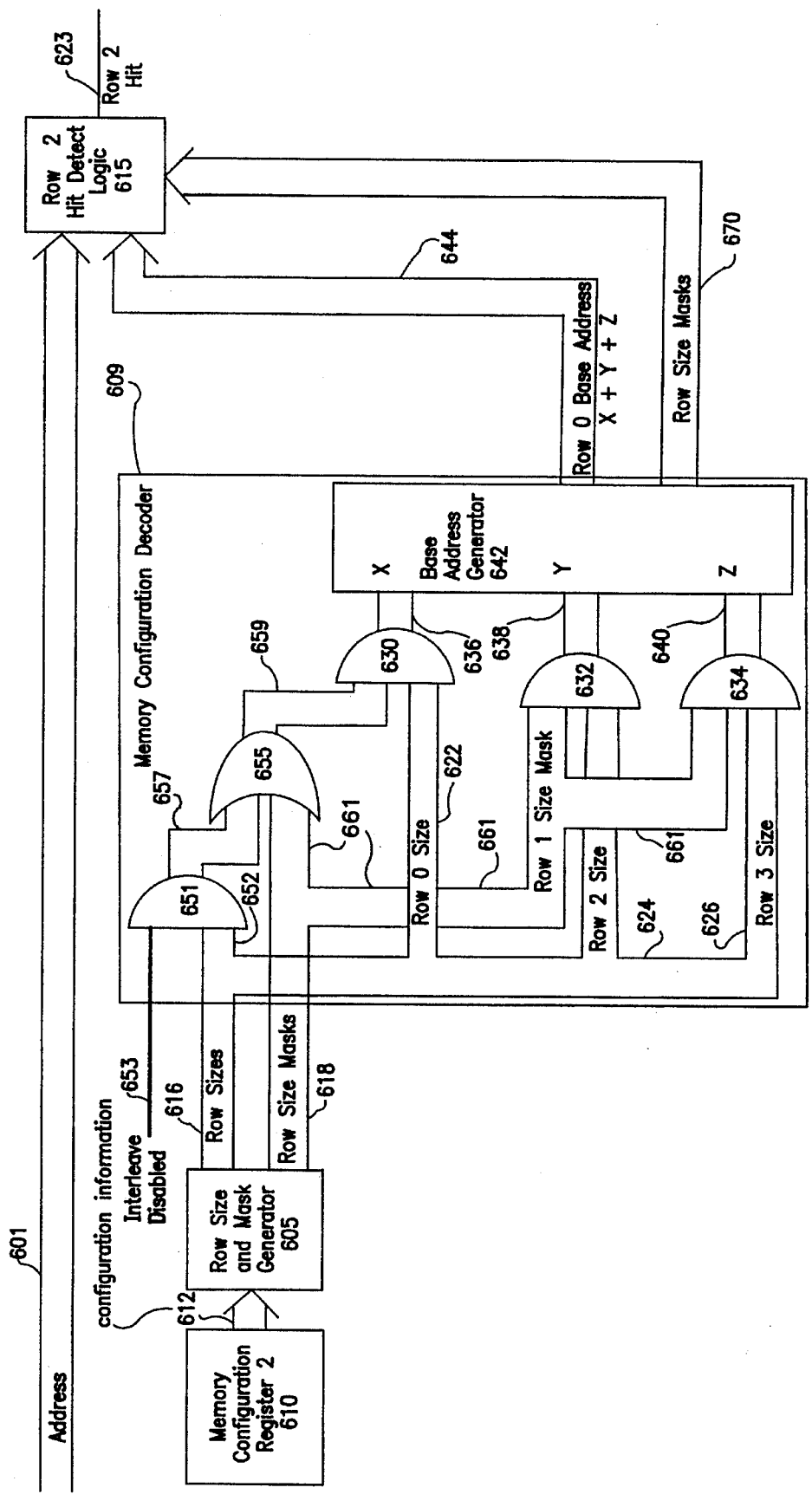
FIG. 6 illustrates a memory configuration decoder with default row ordering and interleaving logic.

Referring now to FIG. 6, a memory configuration decoder including circuitry for resolving the default ordering of rows is illustrated. FIG. 6 also shows a memory configuration decoder designed for use with interleaved memory rows. Default row ordering provides a means for resolving a condition when the same row base address is produced for two rows of the same size. This may happen when two rows have the same number of banks and the same type of DRAMs installed. The portion of circuit illustrated in FIG. 6 for accomplishing default row ordering is described below.

In the example illustrated in FIG. 6, Row 0 and Row 2 are interleaved. In this case, memory configuration decoder 609 includes additional logic for handling the interleaved rows while an interleave mode is active. Thus, in order for memory configuration decoder 609 to automatically compute a base address for Row 2, the state of interleave mode must be checked and the size of Row 0 must be checked.

Referring to FIG. 6, ANDing logic 651 is provided within memory configuration decoder 609. ANDing logic 651 receives an interleave disabled signal on line 653 or alternatively a negated interleave enable signal. The interleave disabled signal is asserted if the interleave mode is not active. ANDing logic 651 also receives as input the Row 2 row size on lines 652. If interleaving of rows is disabled as indicated by a signal on line 653, the Row 2 row size is output by ANDing logic 651 on lines 657. If, however, row interleaving mode is enabled, ANDing logic 651 outputs a zero on lines 657.

The output of ANDing logic 651 on lines 657 is received by ORing logic 655. ORing logic 655 also receives as input on lines 661 the Row 2 row size mask. If row interleaving is enabled, ORing logic 655 simply outputs Row 2 row size mask on lines 659. If, however, row interleaving is disabled, ORing logic 655 combines the Row 2 row size with the Row 2 row size mask thereby producing a row size mask corresponding to a row size smaller than the size of Row 2.

The reason for OR gate 655 is to provide a default row order for the case where Row 0 and Row 2 are the same size. If Row 0 and Row 2 are the same size and if both used the logic shown in FIG. 5 to compute the base address, both rows would be assigned the same base address. When row interleaving is disabled, OR gate 655 basically acts as a tie breaker, causing the circuit illustrated in FIG. 6 to assign Row 2 a base address above that of Row 0. When row interleaving is enabled, both Row 0 and Row 2 are assigned the same base address.

The result of ORing logic 655 is output on lines 659 and received by ANDing logic 630. ANDing logic 630 also receives as input the Row 0 row size on lines 622. In the same manner described above for a noninterleaved row, ANDing logic 630 outputs the size of Row 0 if the size of Row 0 is greater than the row size corresponding to the value received on input lines 659. The output of ANDing logic 630 is provided to base address generator 642 on lines 636. If the size of Row 0 is less than or equal to the row size corresponding to the value received on input lines 659, a zero value is output on lines 636. In a similar manner, ANDing logic 632 compares the size of Row 2 with the size of Row 1. If the size of Row 1 is greater than the size of Row 2, ANDing logic 632 outputs the size of Row 1 on output lines 638. If, however, the size of Row 1 is less than or equal to the size of Row 2, a zero value is output on lines 638. Similarly, ANDing logic 634 compares the size of Row 2 with the size of Row 3. If the size of Row 3 is greater than the size of Row 2, ANDing logic 634 outputs the size of Row 3 on output lines 640. If, however, the size of Row 3 is less than or equal to the size of Row 2, a zero value is output on lines 640.

Lines 636, 638 and 640 are each received as input by base address generator 642. Base address generator 642 sums the input received on lines 636, lines 638, and lines 640 and generates a base address for Row 2 on output lines 644.

In a similar manner described above for Row 0, a Row 2 hit detect logic circuit 615 receives a Row 2 base address on input lines 644, the row size masks on lines 670, and a current address on input lines 601. If the current address received on lines 601 is within the address region defined by the Row 2 base address plus the size of Row 2 as defined by the row size mask, a Row 2 hit signal is asserted on lines 623.

The Row hit detect logic 215 illustrated in FIG. 2 comprises the combination of row hit detect logic circuits for each row (for example, Row 0 hit detect logic 515 and Row 2 hit detect logic 615). Referring again to FIG. 2, hit detect logic 215 receives an address on address lines 201 and a row base address and a row size mask on line 217. The row size mask defines the address bits of the address received on lines 201 that must be tested to determine if a row hit condition exists for the current memory access. Thus, for bits of the row size mask that are set to a value of zero, the corresponding bit positions in the address received on lines 201 may be ignored for the row hit determination.

In a manner similar to row hit detect logic 215, page hit detect logic 219 determines if a page hit condition exists for a current memory access. Again referring to FIG. 2, page hit detect logic 219 receives an address on address lines 201 and row size masks on line 230. The row size masks define the address bits of the address received on lines 201 that must be tested to determine if a page hit condition exists for the current memory access. Bits in the address received on lines 201 may be ignored for the page hit determination if corresponding bits in the row size masks are set to zero.

It will be apparent to those skilled in the art that the memory configuration decoder 609 with a row interleave capability as illustrated in FIG. 6 is replicated in a system containing more than one pair of interleaved rows. It will also be apparent to those skilled in the art that the present invention may be used with a random access memory containing a greater number or a fewer number of interleaved rows.

Although the preferred embodiment details handling interleaving the memory rows in pairs, it will be apparent to those skilled in the art that the means and methods taught herein may also be used to interleave the rows in groups of 4, 8, 16, 32, or more rows. In order to support these wider interleaving cases, additional logic is added to the Row Size and Row Mask generation logic to adjust the Row Size and Row Mask to account for the fact that the rows are selected for interleaving (i.e. to account for the composite row size after interleaving).

Having described the structure and operation of the preferred embodiment of the present invention, the invention may be readily used for the automatic configuration of memory in a computer system, such as the computer system illustrated in FIG. 1. In the preferred embodiment, processing logic stored in a read only memory 104 (or other memory device) and executed by processor 101 is used to perform the following memory configuration process.

The following general process can be used to test the main memory for population information and DRAM size. This information may thereafter be stored into memory configuration registers 203. The testing is performed on a row-by-row basis, first testing for row population and then for row size.

DRAM size is determined by writing four unique values to four select addresses in memory. Several of these addresses may map to the same physical DRAM location depending on the size of memory (see Table 1). For example, when the location 1 C00 (in hex) is written and read back, the data should be exactly that which was written to that address. Any deviation from this result means that one or more of the three other addresses to which data was written represent the same physical DRAM location for that particular size of DRAM. Thus, from the data which is read back, the size of the DRAM devices for that row can be determined. The detailed process steps are illustrated in pseudo code in Appendix A below.

TABLE 1

Physical DRAM Address Mapping For Various DRAM/Address Combinations

|  |  | Address (in hex) | | | |
| --- | --- | --- | --- | --- | --- |
|  |  | 1C00 | 0C00 | 0400 | 0000 |
| DRAM Size | 4 Meg | 1C00 | 0C00 | 0400 | 0000 |
|  | 1 Meg | 0C00 | 0C00 | 0400 | 0000 |
|  | 256K | 0400 | 0400 | 0400 | 0000 |
|  | 64K | 0000 | 0000 | 0000 | 0000 |

Thus, a memory configuration system for automatically generating a base address for each row without pre-computing the base address for each row is described.

Although the present invention has been described herein with reference to a specific preferred embodiment, many modifications and variations therein will readily occur to those skilled in the art. Accordingly, all such variations and modifications are included within the intended scope of the present invention as defined by the following claims.

APPENDIX A

```
{MEMORY POPULATION AND SIZING PROCESS}
Begin
  For all Rows Do
    Disable all rows
    Enable row to be tested as 4 Meg DRAMS, 4-way interleave
{Test for Dword Interleave factor by writing }
{across the entire row of memory }
    Write 5AC3h to address 1C00h
    Write 5AC3h to address 1C04h
    Write 5AC3h to address 1C08h
    Write 5AC3h to address 1C0Ch
    If address 1C00 = 5AC3h Then
      DRAM exists in Word0
      Disp = 00h
    If address 1C04 = 5AC3h Then
      DRAM exists in Word1
      Disp = 04h
    If address 1C08 = 5AC3h Then
      DRAM exists in Word2
      Disp = 08h
    If address 1C0C = 5AC3h Then
      DRAM exists in Word3
      Disp = 0Ch
{Now test for DRAM address size }
```

APPENDIX A

```
    Write 5AC3h to address 1C00H + Disp
    Write 5AD2h to address 0C00H + Disp
    Write 5AE1h to address 0400H + Disp
    Write 5AF0h to address 0000H + Disp
    Row Size Bits = [1C00 + Disp AND 03h
  End For
END.
```

We claim:

1. In a memory system including a plurality of memory rows, said memory system including a first row and a second memory row interleaved in said plurality of memory rows, a memory decoding system that automatically calculates a row base address of said first memory row, said memory decoding system comprising:

means for receiving a row size corresponding to each of said memory rows;

means for generating a row size mask coupled to said means for receiving, said means for generating said row size mask generating said row size mask corresponding to said first memory row, said row size mask producing a zero when ANDed with row size of a second memory row smaller than row size corresponding to the row size mask, said row size mask further producing row size of a third memory row when ANDed with row size corresponding to said third memory row, row size corresponding to said third memory row being not less than row size corresponding to the row size mask;

means for ANDing coupled to said means for generating a row size mask and said means for receiving a row size, said means for ANDing producing an AND of size of each of said plurality of memory rows with said row size mask on an output line; and means for adding values corresponding to said ANDing on said output line to produce said row base address of said first memory row.

2. In a memory system having a plurality of memory rows, a memory configuration decoding system for automatically generating a row base address corresponding to a first memory row in said memory rows, said memory configuration decoding system comprising:

means for receiving row sizes corresponding to each of said memory rows;

means for summing coupled to said means for receiving, said means for summing generating said row base address by adding said row sizes corresponding to said memory rows having a row size greater than a row size of said first memory row, wherein the means for summing comprises means for outputting a value corresponding to each of said memory rows, said value corresponding to a row size of a corresponding memory row if the row size of the corresponding memory row is greater than the row size of said first memory row, said value corresponding to zero if the row size of the corresponding memory row is less than the row size of said first memory row, the outputting means comprising means for generating a row size mask corresponding to said first memory row, said row size mask producing a zero when ANDed with a row size of a second memory row smaller than a row size corresponding to said first memory row, said row size mask further producing a row size of a third memory row when ANDed with a row size of said third memory row, row size of said third memory row being greater than a row size corresponding to said first memory row, and means for producing a logical AND function of said row size corresponding to each of said memory rows with said row size mask, output of said logical AND function corresponding to the plurality of values respectively corresponding to each of said memory rows output by said means for outputting;

an adder means coupled to said means for outputting for adding a plurality of values respectively corresponding to each of said memory rows; and means for receiving an interleave disable signal, said interleave disable signal indicating if said first memory row and a fourth memory row are interleaved, a row size of said first memory row being equal to a row size of said fourth memory row.

3. The memory system of claim 2 wherein said first memory row is assigned said row base address which is lower than an address assigned said fourth memory row.

4. The memory system of claim 2 wherein:

said interleave disable signal indicates that said first memory row and said fourth memory row are not interleaved;

said means for generating a row size mask generates a row size mask corresponding to a smaller row size corresponding to said fourth memory row such that said means for outputting outputs the row size of said fourth memory row thereby said row base address of said first row that is higher than row base address of said fourth memory row.

5. The memory system of claim 2 wherein said interleave memory disable signal indicates that said first memory row and said fourth memory row are interleaved such that said first memory row is assigned said row base address equal to row base address of said fourth row.

6. A computer system comprising:

a processor for sending a memory address and control signals for a memory access;

a bus coupled to said processor for carrying said memory address and said control signals;

a memory for storing bits of data, said memory comprising a plurality of memory rows;

a memory controller coupled to said bus and to said memory, for receiving said memory address and control signals, said memory controller including a memory configuration decoding system that automatically calculates a row base address corresponding to a first memory row in said plurality of memory rows, said memory controller using said row base address to determine if said memory address is in said first memory row; and first means for receiving an interleave disable signal, said interleave disable signal indicating if said first memory row and a fourth memory row are interleaved, the row size of said first memory row being equal to a row size corresponding to said fourth memory row;

wherein the memory configuration decoding system comprises i) second means for receiving a row size corresponding to each of said memory rows, and ii) means for summing coupled to said second means for receiving, said means for summing generating said row base address by adding the row sizes corresponding to said memory rows whose row size is greater than the row size corresponding to said first memory row, and wherein the means for summing comprises i) means for outputting a value corresponding to each of said memory rows, said value corresponding to a row size of the corresponding memory row if the row size of the corresponding memory row is greater than the row size of said first memory row, said value corresponding to zero if the row size of the corresponding memory row is less than the row size corresponding to said first memory row, and ii) an adder means coupled to said means for outputting for adding a plurality of values respectively corresponding to each of said memory rows; and wherein the means for outputting comprises i) means for generating a row size mask corresponding to said first memory row, said row size mask producing a zero when ANDed with row size of a second memory row smaller than the row size corresponding to said first memory row, said row size mask further producing row size of a third memory row when ANDed with row size of said third memory row, row size of said third memory row being greater than row size corresponding to said first memory row, and ii) means for producing a logical AND function of the row size corresponding to each of said memory rows with said row size mask, the output of said logical AND function corresponding to the plurality of values respectively corresponding to each of said memory rows output in said step of outputting.

7. The computer system of claim 6 wherein said first memory row is assigned said row base address which is lower than an address assigned said fourth memory row.

8. The computer system of claim 7 wherein:

said interleave disable signal indicates that said first memory row and said fourth memory row are not interleaved;

said means for generating a row size mask generates a row size mask corresponding to a smaller row size corresponding to said fourth memory row such that said means for outputting outputs the row size of said fourth memory row such that said row base address of said first row that is higher than row base address of said fourth memory row.

9. The computer system of claim 6 wherein said interleave disable signal indicating that said first memory row and said fourth memory row are interleaved such that said first memory row is assigned said row base address equal to row base address of said fourth row.

* * * * *

UNITED STATES PATENT AND TRADEMARK OFFICE
CERTIFICATE OF CORRECTION

PATENT NO.    :   5,572,692
DATED         :   November 5, 1996
INVENTOR(S)   :   Murdoch et al.

It is certified that error appears in the above-identified patent and that said Letters Patent is hereby corrected as shown below:

In column 7 at line 40 delete "alterative" and insert --alternative--

Signed and Sealed this

Twenty-fifth Day of February, 1997

Attest:

BRUCE LEHMAN

*Attesting Officer*    *Commissioner of Patents and Trademarks*